US011424143B2

(12) United States Patent
Yoshii et al.

(10) Patent No.: US 11,424,143 B2
(45) Date of Patent: Aug. 23, 2022

(54) HEAT INSULATION STRUCTURE AT LOWER END OF VERTICAL HEAT TREATMENT APPARATUS AND VERTICAL HEAT TREATMENT APPARATUS INCLUDING HEAT INSULATION STRUCTURE THEREOF

(71) Applicant: Tokyo Electron Limited, Tokyo (JP)

(72) Inventors: Koji Yoshii, Iwate (JP); Tatsuya Yamaguchi, Iwate (JP); Hiroyuki Hayashi, Yamanashi (JP); Mitsuhiro Okada, Yamanashi (JP); Satoshi Takagi, Yamanashi (JP); Toshihiko Takahashi, Yamanashi (JP); Masafumi Shoji, Iwate (JP); Kazuya Kitamura, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 740 days.

(21) Appl. No.: 16/297,858

(22) Filed: Mar. 11, 2019

(65) Prior Publication Data
US 2019/0287828 A1 Sep. 19, 2019

(30) Foreign Application Priority Data
Mar. 13, 2018 (JP) .............................. JP2018-045873

(51) Int. Cl.
*H01L 21/67* (2006.01)
*H01L 21/673* (2006.01)

(52) U.S. Cl.
CPC .. *H01L 21/67109* (2013.01); *H01L 21/67017* (2013.01); *H01L 21/67115* (2013.01); *H01L 21/67309* (2013.01)

(58) Field of Classification Search
CPC ......... H01L 21/67011; H01L 21/67098; H01L 21/67109; H01L 21/67115; H01L 21/67103; H01L 21/67017; H01L 21/67303; H01L 21/67309; H01L 21/677; H01L 21/67739; C23C 16/46
See application file for complete search history.

(56) References Cited

U.S. PATENT DOCUMENTS

| 2010/0051597 A1* | 3/2010 | Morita .............. H01L 21/67109 |
| | | 219/201 |
| 2018/0135179 A1* | 5/2018 | Ikeuchi ................... C23C 16/46 |

FOREIGN PATENT DOCUMENTS

| CN | 105135883 A | * 12/2015 |
| JP | H05-36609 A | 2/1993 |

(Continued)

*Primary Examiner* — John P. Dulka
(74) *Attorney, Agent, or Firm* — Venjuris, P.C.

(57) ABSTRACT

Provided is a heat insulation structure used for a vertical heat treatment apparatus that performs a heat treatment on a substrate. The vertical heat treatment apparatus includes: a processing container having a double tube structure including an inner tube and an outer tube closed upward, the processing container having an opening at a lower end thereof; a gas supply section and exhaust section provided on a lower side of the processing container; a lid configured to introduce or discharge the substrate into or from the opening and to open/close the opening; and a heating section provided to cover the processing container from an outside. The heat insulation structure is provided between the inner tube and the outer tube.

7 Claims, 9 Drawing Sheets

(56) References Cited

FOREIGN PATENT DOCUMENTS

| | | |
|---|---|---|
| JP | 2002-280375 A | 9/2002 |
| JP | 2002-319546 A | 10/2002 |
| JP | 2004-119510 A | 4/2004 |
| JP | 2012-064804 A | 3/2012 |
| KR | 10-2015-0031453 A | 3/2015 |
| TW | 201016886 A | 5/2010 |
| WO | WO-2021187277 A1 * | 9/2021 ............. H01L 21/31 |

* cited by examiner

HEAT INSULATION STRUCTURE AT LOWER END OF VERTICAL HEAT TREATMENT APPARATUS AND VERTICAL HEAT TREATMENT APPARATUS INCLUDING HEAT INSULATION STRUCTURE THEREOF

CROSS-REFERENCE TO RELATED APPLICATIONS

This application is based on and claims priority from Japanese Patent Application No. 2018-045873, filed on Mar. 13, 2018, with the Japan Patent Office, the disclosures of which are incorporated herein in their entireties by reference.

TECHNICAL FIELD

The present disclosure relates to a heat insulation structure and a vertical heat treatment apparatus.

BACKGROUND

In the related art, as one of semiconductor manufacturing apparatuses, a vertical heat treatment apparatus has been known, in which a substrate holding unit holding a plurality of substrates at intervals in a height direction is carried into a processing container surrounded by a heating section capable of zone control in the height direction so as to perform a heat treatment on the substrates (see, e.g., Japanese Patent Laid-open Publication No. 2012-064804). Meanwhile, in the vertical heat treatment apparatus, measures against heat radiation to a furnace mouth portion have been taken with, for example, a heat insulating cylinder, a manifold heater, and a cap heater (see, e.g., Japanese Patent Laid-open Publication No. 2012-064804).

SUMMARY

According to an embodiment of the present disclosure, there is provided a heat insulation structure used for a vertical heat treatment apparatus that performs a heat treatment on a substrate. The vertical heat treatment apparatus includes: a processing container having a double tube structure including an inner tube and an outer tube closed upward, the processing container having an opening at a lower end thereof; a gas supply section and exhaust section provided on a lower side of the processing container; a lid configured to introduce or discharge the substrate into or from the opening and to open/close the opening; and a heating section provided to cover the processing container from an outside. The heat insulation structure is provided between the inner tube and the outer tube.

The foregoing summary is illustrative only and is not intended to be in any way limiting. In addition to the illustrative aspects, embodiments, and features described above, further aspects, embodiments, and features will become apparent by reference to the drawings and the following detailed description.

DESCRIPTION OF EMBODIMENT

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, embodiments for carrying out the present disclosure will be described with reference to drawings. Meanwhile, in the specification and drawings, the same reference numerals are used to denote substantially the same components, and redundant descriptions will be omitted.

First Embodiment

Figure 1:
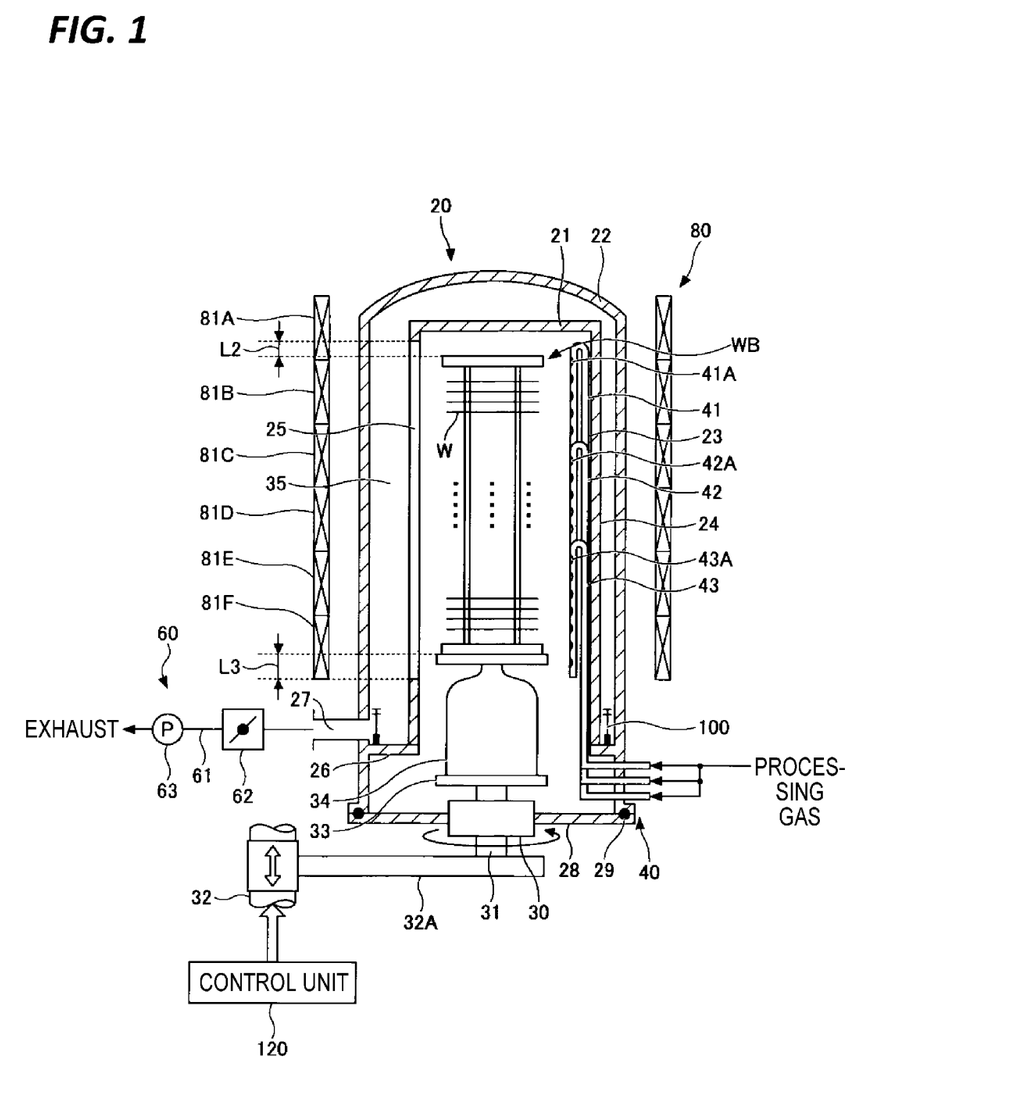
FIG. 1 is a cross-sectional view illustrating an example of the overall configuration of a vertical heat treatment apparatus according to a first embodiment.
Figure 2:
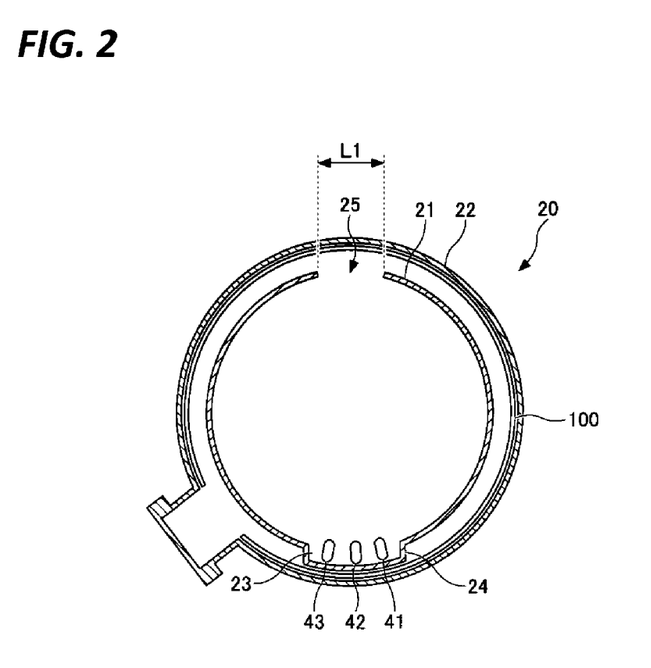
FIG. 2 is a view illustrating a processing container in FIG. 1.
Figure 3:
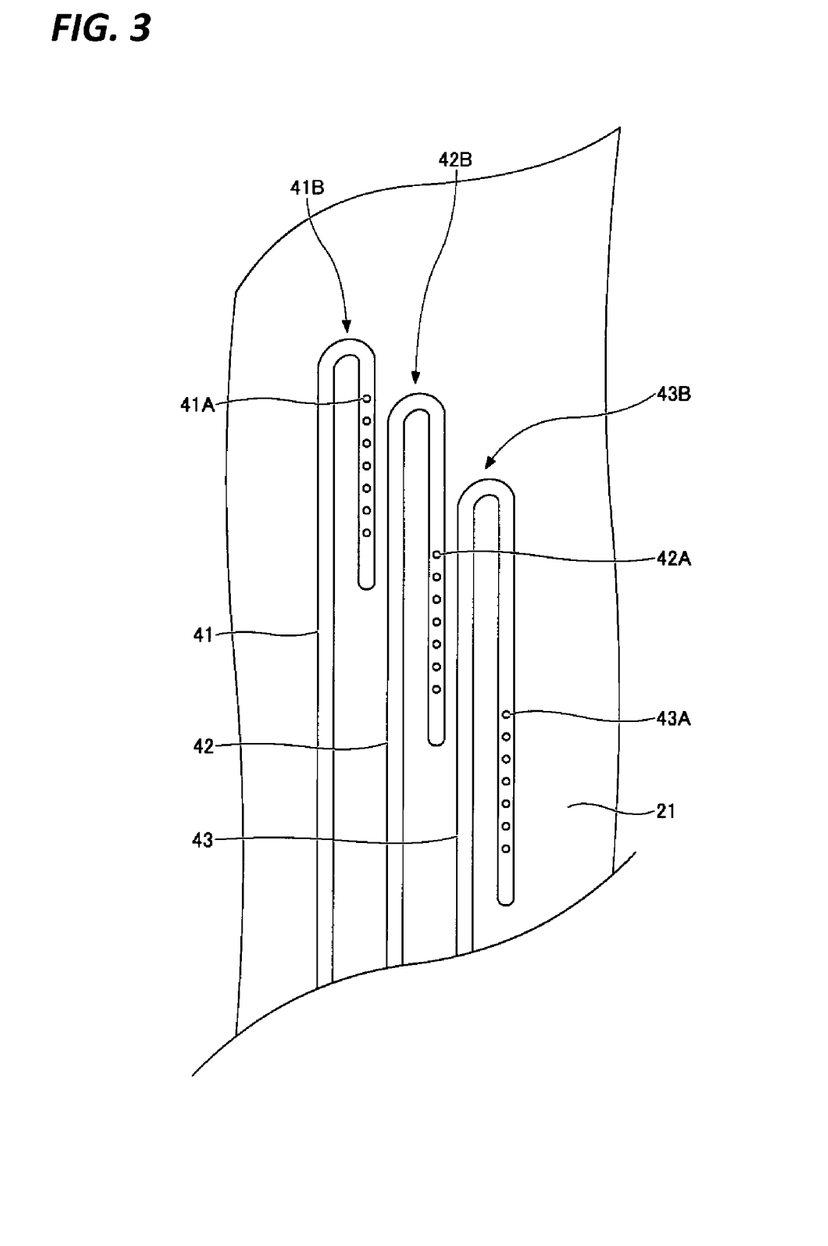
FIG. 3 is a view illustrating a gas supply section in FIG. 1.
Figure 4:
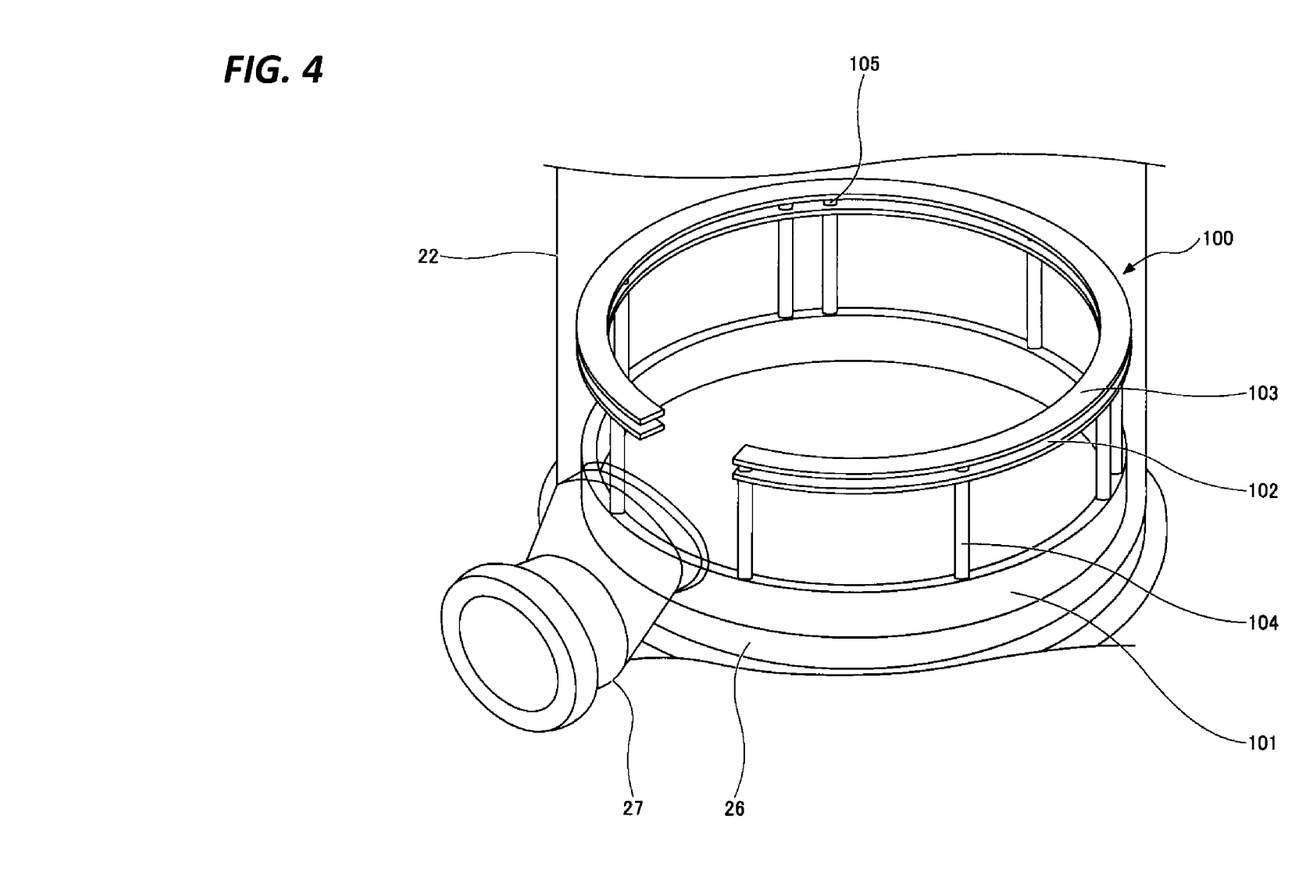
FIG. 4 is a perspective view illustrating a heat insulation structure in FIG. 1.

An example of a vertical heat treatment apparatus according to a first embodiment will be described. FIG. 1 is a cross-sectional view illustrating an example of the overall configuration of a vertical heat treatment apparatus according to the first embodiment. FIG. 2 is a view illustrating a processing container in FIG. 1. FIG. 3 is a view illustrating a gas supply section in FIG. 1. FIG. 4 is a perspective view illustrating a heat insulation structure in FIG. 1.

The vertical thermal processing apparatus has a processing container 20, a gas supply section 40, an exhaust section 60, a heating section 80, a heat insulation structure 100, and a controller 120.

The processing container 20 accommodates a wafer boat WB which is an example of a substrate holder. The wafer boat WB holds semiconductor wafers (hereinafter referred to as "wafers W"), which are an example of a plurality of substrates, at predetermined intervals in the height direction. The processing container 20 has an inner tube 21 and an outer tube 22. The inner tube 21 has a cylindrical shape including a ceiling and a lower open end. The ceiling portion of the inner tube 21 is formed, for example, flat. The outer tube 22 has a cylindrical shape including a ceiling and a lower open end to cover the outside of the inner tube 21. That is, the upper portion of the outer tube 22 is closed. The inner tube 21 and the outer tube 22 are coaxially arranged to have a double-tube structure. The inner tube 21 and the outer tube 22 are formed of a heat resistant material such as, for example, quartz.

On one side of the inner tube 21, a nozzle accommodation portion 23 configured to accommodate a gas nozzle is provided along the longitudinal direction (vertical direction). For example, as illustrated in FIG. 2, the nozzle accommodation portion 23 is formed by making a portion of the side wall of the inner tube 21 protrude outward so as to form a convex portion 24, and the inside of the convex portion 24 is formed as a nozzle accommodation portion 23. In the side wall of the inner tube 21 opposite the nozzle accommodation portion 23, a rectangular opening 25 having a width L1 is provided in the longitudinal direction thereof (vertical direction).

The opening 25 is a gas exhaust port formed to be able to exhaust the gas in the inner tube 21. The length of the opening 25 in the vertical direction is equal to the length of the wafer boat WB in the vertical direction, or extends upward and downward in the vertical direction to be longer than the length of the wafer boat WB. That is, the upper end of the opening 25 extends to a height equal to or higher than the position corresponding to the upper end of the wafer boat WB, and the lower end of the opening 25 extends to a height equal to or lower than the position corresponding to the lower end of the wafer boat WB. Specifically, for example, as illustrated in FIG. 1, the distance L2 between the upper end of the wafer boat WB and the upper end of the opening 25 in the height direction may be in the range of about 0 mm to 5 mm. In addition, the distance L3 between the lower end of the wafer boat WB and the lower end of the opening 25 in the height direction is in the range of about 0 mm to 350 mm.

On the inner wall of the lower portion of the outer tube 22, an annular support portion 26 is provided. The support portion 26 supports the lower end portion of the inner tube 21. A gas outlet 27 is formed in the side wall of the outer tube 22 and above the support portion 26. A lid 28, which is an example of a lid unit, is hermetically attached to the opening at the lower end of the outer tube 22 via a sealing member 29 such as an O-ring, and the opening at the lower end of the processing container 20 is hermetically closed. The lid 28 is configured to be able to open/close the opening portion. The lid 28 is made of, for example, stainless steel.

In the center of the lid 28, a rotary shaft 31 is provided through a magnetic fluid seal unit 30. The lower portion of the rotary shaft 31 is rotatably supported by an arm 32A of a lift unit 32 configured as a boat elevator.

A rotary plate 33 is provided at the upper end of the rotary shaft 31. On the rotary plate 33, a wafer boat WB is placed via a quartz heat-insulating base 34. Therefore, by moving the lift unit 32 up and down, the lid 28 and the wafer boat WB move vertically as a unit, so that the wafer boat WB can be inserted into and removed from the processing container 20.

The gas supply unit 40 introduces a predetermined gas into the processing container 20. The gas supply section 40 is provided in the lower portion of the outer tube 22, and introduces a predetermined gas into the inner tube 21. The gas supply unit 40 has a plurality of (e.g., three) gas nozzles 41, 42, 43.

The gas nozzles 41, 42, 43 are formed of, for example, quartz tubes having a circular cross section. The gas nozzles 41, 42, 43 are arranged in a row in the nozzle accommodation portion 23 of the inner tube 21 in the circumferential direction. Each of the base end sides of the gas nozzles 41, 42, 43 is connected to, for example, the inner wall portion of the outer tube 22, and the tip end sides thereof are closed. The gas nozzles 41, 42, 43 extend inward from the inner wall of the outer tube 22 and are bent in an L shape so as to vertically rise upward along the inner wall of the inner tube 21, and the distal end portions thereof are bent downward in a U shape so as to extend vertically. In the illustrated example, the gas nozzles 41, 42, 43 are bent toward the inside of the inner tube 21, but the gas nozzles 41, 42, 43 may be bent, for example, in the circumferential direction of the inner tube 21. In addition, the gas nozzles 41, 42, 43 may be provided such that the tip end portions thereof rise vertically upward along the inner wall of the inner tube 21 without being bent.

Each of the gas nozzles 41, 42, 43 is formed such that the height positions of the bent portions 41B, 42B, 43B thereof are different from each other. The gas nozzle 41 is bent, for example, above the ceiling of the wafer boat WB. The gas nozzle 43 is bent, for example, above the tip portion of the gas nozzle 41, and the tip portion thereof is provided to be located below the wafer boat. The gas nozzle 42 is bent, for example, at a height position between the bent portions 41B, 43B of the gas nozzles 41, 43, and the tip end portion thereof is provided at the height position between the tip portions of the gas nozzles 41, 43. The gas nozzles 41, 42, 43 are matched to each other in the shapes of the bent portions 41B, 42B, 43B thereof. In addition, the gas nozzles 41, 42, 43 are arranged such that the distances between the gas supply pipes on the downstream side of the bent portions 41B, 42B, 43B and the outer edges of the wafers W held in the wafer boat WB are equal to each other.

In the gas nozzles 41, 42, 43, gas ejection holes 41A, 42A, 43A are formed on the tip end sides thereof from the bent portions 41B, 42B, 43B, respectively. The gas ejection holes 41A, 42A, 43A have, for example, circular shapes of the same size, and are formed, for example, at regular intervals in the length direction of the gas nozzles 41, 42, 43. The gas ejection holes 41A, 42A, 43A eject a gas in the horizontal direction toward the wafer boat WB. Since the height positions of the bent portions 41B, 42B, 43B are different from each other, the height positions of the gas ejection holes 41A, 42A, 43A are different between the gas nozzles 41, 42, 43. In this manner, the gas ejection holes 41A, 42A, 43A supply a gas to a plurality of divided regions, respectively, in the height direction of the processing container 20 in which the wafers W are arranged. In the illustrated example, the gas ejection holes 41A supply the gas to the upper region of the wafer boat WB, the gas ejection holes 42A supply the gas to the central region of the wafer boat WB, and the gas ejection holes 43A supply the gas to the lower region of the wafer boat WB.

A predetermined gas may be, for example, a processing gas such as a film-forming gas, an etching gas, or a cleaning gas. In addition, the predetermined gas may be, for example, a purge gas for purging the processing gas. The predetermined gas is introduced into the processing container 20 from the gas nozzles 41, 42, 43 with a controlled flow rate.

The exhaust section 60 exhausts the gas in the processing container 20. The exhaust section 60 includes an exhaust passage 61 connected to the gas outlet 27. A pressure regulating valve 62 and a vacuum pump 63 are sequentially interposed in the exhaust passage 61, so that the inside of the processing container 20 can be evacuated. The exhaust section 60 exhausts the gas in the inner tube 21 discharged from the opening 25 through, for example, a space portion 35 between the inner tube 21 and the outer tube 22.

The heating section 80 heats the wafers W accommodated in the processing container 20. The heating section 80 is formed in a cylindrical shape, for example, on the outer circumferential side of the outer tube 22 so as to cover the outer tube 22. The heating section 80 includes, for example, a plurality of heaters 81A, 81B, 81C, 81D, 81E, 81F arranged from the upper side toward the lower side. Since the heating section 80 includes a plurality of divided heaters, it is possible to independently control the temperature in the vertical direction. However, the heating section 80 may include a single heater which is not divided.

The heat insulation structure 100 is provided in a gap between the inner tube 21 and the outer tube 22. The heat insulation structure 100 is provided on, for example, the support portion 26. As illustrated in FIG. 4, the heat insulation structure 100 includes a lower member 101, a first upper member 102, a second upper member 103, a first connection member 104, and a second connection member 105. Each of the lower member 101, the first upper member 102, the second upper member 103, the first connection member 104, and the second connection member 105 is formed of a heat insulation material. The heat insulation material may be, for example, quartz such as transparent quartz or opaque quartz, ceramic such as aluminum nitride, or silicon nitride.

The lower member 101 is an example of a support member that supports the first upper member 102 and the second upper member 103. The lower member 101 is disposed on the support portion 26 along the outer circumferential surface of the inner tube 21 (the inner circumferential surface of the outer tube 22). The lower member 101 is formed in, for example, an annular shape. The lower member 101 is formed such that, for example, the inner diameter thereof is equal to or larger than the outer diameter of the inner tube 21, and such that the outer diameter thereof is equal to or smaller than the inner diameter of the outer tube 22.

The first upper member 102 is connected to the upper side of the lower member 101 via the first connection member 104, and is arranged along the outer circumferential surface of the inner tube 21. The first upper member 102 is a C-shaped plate-like member having a notch formed in a portion in the circumferential direction (e.g., a position corresponding to the gas outlet 27). The first upper member 102 is formed such that, for example, the inner diameter thereof is equal to or larger than the outer diameter of the inner tube 21, and such that the outer diameter thereof is equal to or smaller than the inner diameter of the outer tube 22.

The second upper member 103 is connected to the upper side of the first upper member 102 via the second connection member 105, and is arranged along the outer circumferential surface of the inner tube 21. The second upper member 103 may have the same configuration as the first upper member 102. That is, the second upper member 103 is a C-shaped plate-like member having a notch formed in a portion in the circumferential direction (e.g., a position corresponding to the gas outlet 27). The second upper member 103 is formed such that, for example, the inner diameter thereof is equal to or larger than the outer diameter of the inner tube 21, and such that the outer diameter thereof is equal to or smaller than the inner diameter of the outer tube 22. From the viewpoint of both of the suppression of heat radiation of the furnace mouth portion and a crack of wafers, the height position of the upper surface of the second upper member 103 (the height position of the uppermost portion of the heat insulation structure 100) may be higher than the height position of the upper end of the gas outlet 27 and lower than the higher height position among the height position of the lower end of the wafer boat WB and the height position of the lower end of the heating section 80 (a heater 81F).

The first connection member 104 is an example of a support member that supports the first upper member 102. The first connection member 104 connects the lower member 101 and the first upper member 102. The first connection member 104 is formed of, for example, a plurality of rod-shaped members. The plurality of rod-shaped members is arranged, for example, at predetermined intervals along the outer circumference of the inner tube 21. One end of each bar-shaped member is connected to the upper surface of the lower member 101, and the other end is connected to the lower surface of the first upper member 102. The respective rod-shaped members of the first connection member 104 are formed to have the same length, for example.

The second connection member 105 is an example of a support member that supports the second upper member 103. The second connection member 105 connects the first upper member 102 and the second upper member 103. The second connection member 105 is formed of, for example, a plurality of rod-shaped members. The plurality of rod-shaped members is arranged, for example, at predetermined intervals along the outer circumference of the inner tube 21. One end of each bar-shaped member is connected to the upper surface of the first upper member 102, and the other end is connected to the lower surface of the second upper member 103. The respective rod-shaped members of the second connection member 105 are formed to have the same length, for example.

The control unit 120 includes a central processing unit (CPU), a read only memory (ROM), and a random access memory (RAM). The CPU executes a desired heat treatment according to a recipe stored in a storage region such as, for example, a RAM. In the recipe, apparatus control information for a process condition is set. The control information may be, for example, a gas flow rate, a pressure, a temperature, and a process time. In addition, a program used by the recipe and control unit 120 may be stored in, for example, a hard disk or a semiconductor memory. In addition, for example, the recipe may be set in a predetermined location in the state of being stored in a storage medium readable by a portable computer such as, for example, a CD-ROM or a DVD. The control unit 120 may be provided separately from the vertical heat treatment apparatus.

According to the first embodiment described above, the heat insulation structure 100 is provided in the gap between the inner tube 21 and the outer tube 22. As a result, the heat insulation structure 100 suppresses heat movement and heat transfer from the wafer processing region where the wafers W are processed in the processing container 20 to the furnace mouth portion. Therefore, since it is possible to suppress heat radiation in the furnace mouth portion of the processing container 20, the inter-surface uniformity of a temperature in the wafer processing region is improved. As a result, the inter-surface uniformity of film characteristics (e.g., a film thickness) is improved.

In the first embodiment, the case where the heat insulation structure 100 has two upper members (the first upper member 102 and the second upper member 103) has been described as an example, but the number of the upper members may be one, or may be three or more.

In addition, in the first embodiment, the case where the lower member 101, the first upper member 102, the second upper member 103, the first connection member 104, and the second connection member 105 are separately formed has been described as an example, but the members may be integrally formed.

In addition, the heat insulation structure 100 may be configured to be capable of being divided into a plurality of portions in the circumferential direction. Since the heat insulation structure 100 is configured to be capable of being divided into a plurality of portions in the circumferential direction, attachment of the heat insulation structure 100 to the processing container 20 is facilitated.

Second Embodiment

Figure 5:
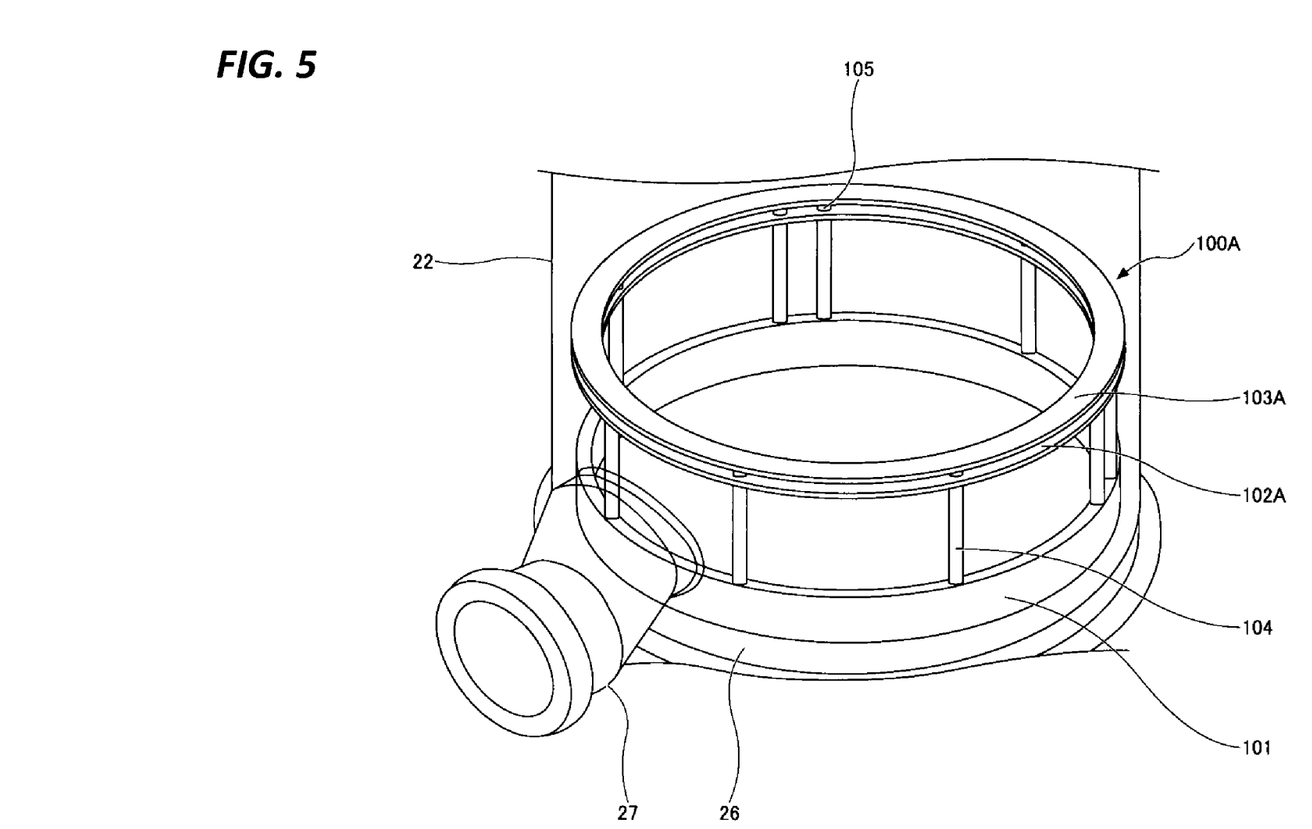
FIG. 5 is a perspective view illustrating a heat insulation structure of a vertical heat treatment apparatus according to a second embodiment.

An example of a vertical heat treatment apparatus according to a second embodiment will be described. The vertical heat treatment apparatus according to the second embodiment is different from the vertical heat treatment apparatus according to the first embodiment in that it has a heat insulation structure 100A instead of the heat insulation structure 100. Hereinafter, differences from the first embodiment will be mainly described. FIG. 5 is a perspective view illustrating the heat insulation structure of the vertical heat treatment apparatus according to the second embodiment.

The heat insulation structure 100A is provided in a gap between the inner tube 21 and the outer tube 22. The heat insulation structure 100A is provided on, for example, the support portion 26. The heat insulation structure 100A includes a lower member 101, a first upper member 102A, a second upper member 103A, first connection member 104, and second connection member 105. Each of the lower member 101, the first upper member 102A, the second upper member 103A, the first connection member 104, and the second connection member 105 is formed of a heat insulation material. The heat insulation material may be, for example, quartz such as transparent quartz or opaque quartz, ceramic such as aluminum nitride, or silicon nitride.

The lower member 101, the first connection member 104, and the second connection member 105 may have the same configurations as in the first embodiment.

The first upper member 102A is connected to the upper side of the lower member 101 via the first connection member 104, and is arranged along the outer circumferential surface of the inner tube 21. The first upper member 102A is formed in, for example, an annular shape. The first upper member 102A is formed such that, for example, the inner diameter thereof is equal to or larger than the outer diameter of the inner tube 21, and such that the outer diameter thereof is equal to or smaller than the inner diameter of the outer tube 22. The height position of the lower surface of the first upper member 102A may be higher than the height position of the upper end of the gas outlet 27 as in the first embodiment.

The second upper member 103A is connected to the upper side of the first upper member 102A via the second connection member 105, and is arranged along the outer circumferential surface of the inner tube 21. The second upper member 103A may have the same configuration as the first upper member 102A. That is, the second upper member 103A is formed in, for example, an annular shape. The second upper member 103A is formed such that, for example, the inner diameter thereof is equal to or larger than the outer diameter of the inner tube 21, and such that the outer diameter thereof is equal to or smaller than the inner diameter of the outer tube 22. As in the first embodiment, the upper surface of the second upper member 103A may be lower than the upper height position among the height position of the lower end of the wafer boat WB and the height position of the lower end of the heating section 80 (the heater 81F).

According to the second embodiment described above, the same effect as the effect achieved by the above-described first embodiment is achieved.

Particularly, according to the second embodiment, since there is no notch formed at a position corresponding to the gas outlet, the heat radiation of the furnace mouth port is further suppressed. Even from the viewpoint of crack of wafers, it is desirable that the heat radiation to the furnace mouth portion is small.

In the second embodiment, the case where the heat insulation structure 100A has two upper members (the first upper member 102A and the second upper member 103A) has been described as an example, but the number of the upper members may one, or may be three or more. Also, a configuration in which a C-shaped upper member and an annular upper member are combined may be used.

In addition, in the second embodiment, the case where the lower member 101, the first upper member 102A, the second upper member 103A, the first connection member 104, and the second connection member 105 are separately formed has been described as an example, but the members may be integrally formed.

In addition, the heat insulation structure 100A may be configured to be capable of being divided into a plurality of portions in the circumferential direction. Since the heat insulation structure 100A is configured to be capable of being divided into a plurality of portions in the circumferential direction, attachment of the heat insulation structure 100A to the processing container 20 is facilitated.

Third Embodiment

Figure 6:
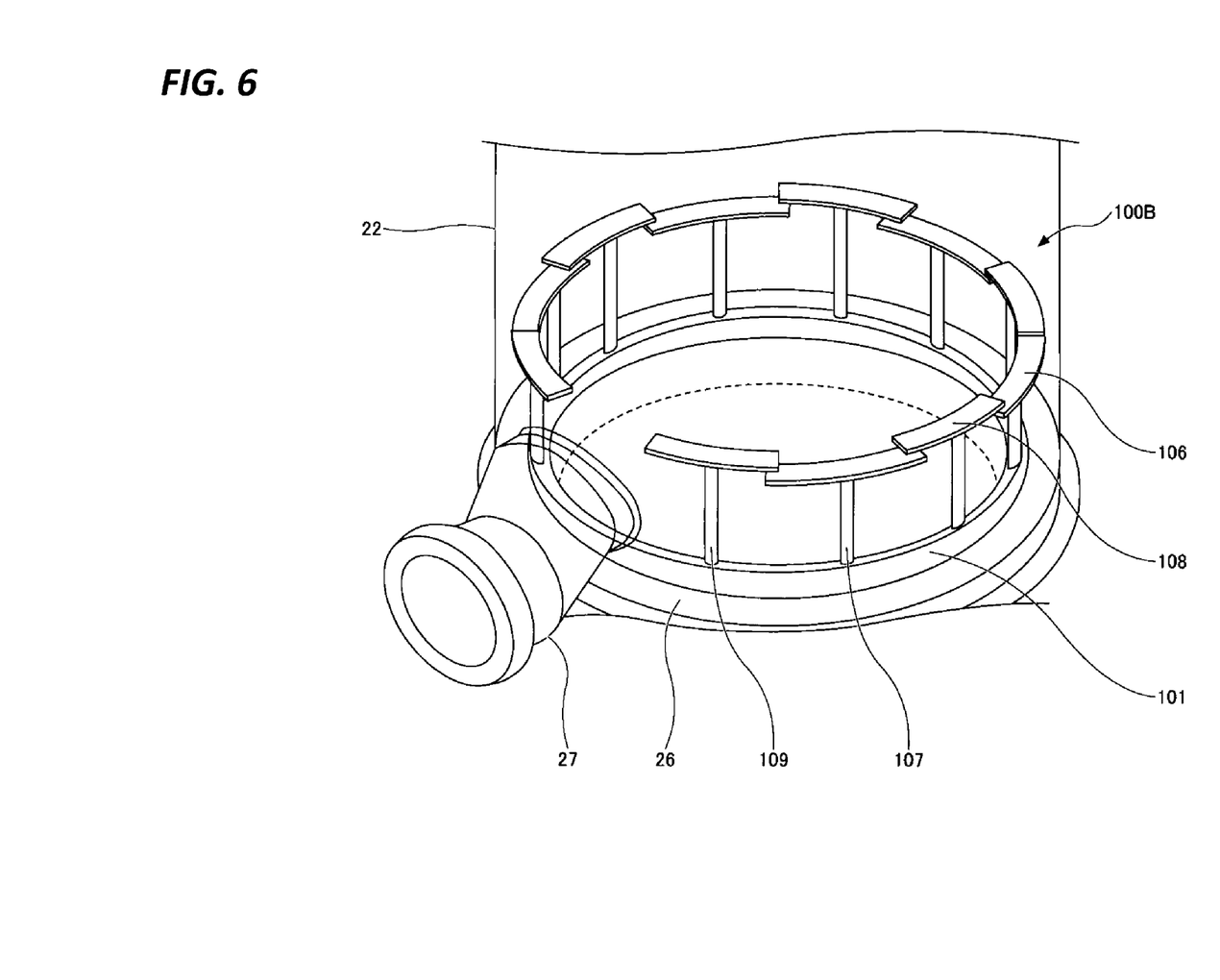
FIG. 6 is a perspective view illustrating a heat insulation structure of a vertical heat treatment apparatus according to a third embodiment.

An example of a vertical heat treatment apparatus according to a third embodiment will be described. The vertical heat treatment apparatus according to the third embodiment is different from the vertical heat treatment apparatus according to the first embodiment in that it has a heat insulation structure 100B instead of the heat insulation structure 100. Hereinafter, differences from the first embodiment will be mainly described. FIG. 6 is a perspective view illustrating a heat insulation structure of a vertical heat treatment apparatus according to a third embodiment.

The heat insulation structure 100B is provided in a gap between the inner tube 21 and the outer tube 22. The heat insulation structure 100B is provided on, for example, the support portion 26. The heat insulation structure 100B includes a lower member 101, a first arc member 106, a third connection member 107, second arc members 108, and a fourth connection member 109. Each of the lower member 101, the first arc member 106, the third connection member 107, the second arc member 108, and the fourth connection member 109 is formed of a heat insulation material. The heat insulation material may be, for example, quartz such as transparent quartz or opaque quartz, ceramic such as aluminum nitride, or silicon nitride.

The lower member 101 may have the same configuration as the first embodiment.

The first arc member 106 is connected to the upper side of the lower member 101 via the third connection member 107, and is arranged along the outer circumferential surface of the inner tube 21. The first arc member 102 is formed in, for example, an arc shape. A plurality of first arc members 106 is provided along the outer circumference of the inner tube.

The third connection member 107 is an example of a support member that supports the first arc member 106. The third connection member 107 connects the lower member 101 and the first arc member 106. The third connection member 107 is formed of, for example, a plurality of rod-shaped members. The plurality of rod-shaped members is arranged, for example, at predetermined intervals along the outer circumference of the inner tube 21. One end of each bar-shaped member is connected to the upper surface of the lower member 101, and the other end is connected to the lower surface of the first arc member 106. Each rod-shaped member has, for example, a first length.

The second arc member 108 is connected to the upper side of the second arc member 101 via the fourth connection member 109, and is arranged along the outer circumferential surface of the inner tube 21. The second arc member 102 is formed in, for example, an arc shape. A plurality of second arc members 108 is provided along the outer circumference of the inner tube.

The fourth connection member 109 is an example of a support member that supports the second arc member 108. The fourth connection member 109 connects the lower member 101 and the second arc member 108. The fourth connection member 109 is formed of, for example, a plurality of rod-shaped members. The plurality of rod-shaped members is arranged, for example, at predetermined intervals along the outer circumference of the inner tube 21. One end of each bar-shaped member is connected to the upper surface of the lower member 101, and the other end is connected to the lower surface of the second arc member 108. Each rod-like member has a second length different from the first length (e.g., longer than the first length).

The plurality of rod-shaped members constituting the third connection member 107 and the plurality of rod-like members constituting the fourth connection member 109 are alternately arranged along the outer circumference of the inner tube 21. In other words, the first arc members 106 provided at a first height position and the second arc members provided at a second height position different from the first height position (e.g., above the first height position) are arranged alternately along the outer circumference of the inner tube 21. In addition, a first arc member 106 and a second arc member 108, which are adjacent to each other, are arranged to partially overlap each other in a plan view.

In addition, the first arc members 106 and the second arc members 108 are not provided at a position corresponding to the gas outlet 27 in a plan view. However, the first arc members 106 and the second arc members 108 may also be provided at a position corresponding to the gas outlet 27 in a plan view.

According to the third embodiment described above, the same effect as the effect achieved by the above-described first embodiment is achieved.

In particular, according to the third embodiment, it is possible to achieve both high suppression of heat radiation and suppression of reduction in exhaust efficiency due to the absence of a clearance in a heat insulation structure in a plan view. Even from the viewpoint of crack of wafers, it is desirable that the heat radiation to the furnace mouth portion is small.

In addition, in the third embodiment, the case where the lower member 101, the first arc member 106, the third connection member 107, the second connection member 108, and the fourth connection member 109 are separately formed has been described as an example, but the members may be integrally formed.

In addition, the heat insulation structure 100B may be configured to be capable of being divided into a plurality of portions in the circumferential direction. Since the heat insulation structure 100B is configured to be capable of being divided into a plurality of portions in the circumferential direction, attachment of the heat insulation structure 100B to the processing container 20 is facilitated.

Fourth Embodiment

Figure 7:
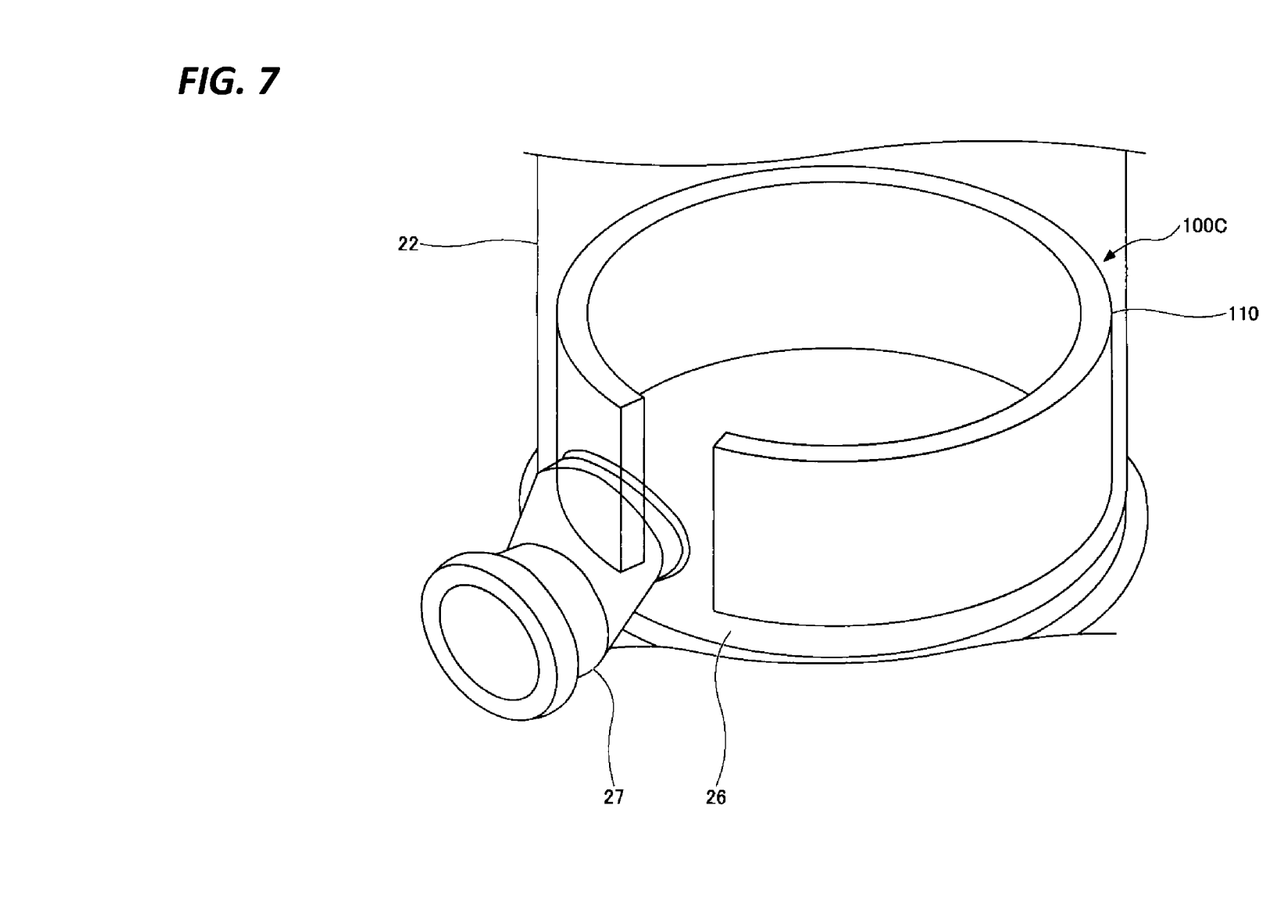
FIG. 7 is a perspective view illustrating a heat insulation structure of a vertical heat treatment apparatus according to a fourth embodiment.

An example of a vertical heat treatment apparatus according to a fourth embodiment will be described. The vertical heat treatment apparatus according to the fourth embodiment is different from the vertical heat treatment apparatus according to the first embodiment in that it has a heat insulation structure 100C instead of the heat insulation structure 100. Hereinafter, differences from the first embodiment will be mainly described. FIG. 7 is a perspective view illustrating a heat insulation structure of a vertical heat treatment apparatus according to a fourth embodiment.

The heat insulation structure 100C is provided in a gap between the inner tube 21 and the outer tube 22. The heat insulation structure 100C is provided on, for example, the support portion 26. The heat insulation structure 110c includes a block-shaped member 110. The block-shape member 110 is formed of a heat insulation material. The heat insulation material may be, for example, quartz such as transparent quartz or opaque quartz, ceramic such as aluminum nitride, or silicon nitride.

The block-shaped member 110 is disposed on the support portion 26 along the outer circumferential surface of the inner tube 21. The block-shaped member 110 includes a notch formed in a portion thereof in the circumferential direction (e.g., a position corresponding to the gas outlet 27) and is formed in a C shape in a plan view. In addition, the block-shaped member 110 may not have the notch and may be formed in an annular shape in a plan view. The block-shaped member 110 is formed such that, for example, the inner diameter thereof is equal to or larger than the outer diameter of the inner tube 21, and such that the outer diameter thereof is equal to or smaller than the inner diameter of the outer tube 22. Like the second upper member 103 in the first embodiment, the height position of the upper surface of the block-shaped member 110 may be lower than the upper height position among the height position of the lower end of the wafer boat WB and the height position of the lower end of the heating section 80 (the heater 81F).

According to the fourth embodiment described above, the same effect as the effect achieved by the above-described first embodiment is achieved.

Particularly, according to the fourth embodiment, by selecting a material having a low thermal conductivity, the heat radiation suppression of the furnace mouth portion is further enhanced. Even from the viewpoint of crack of wafers, it is desirable that the heat radiation to the furnace mouth portion is small.

In addition, the heat insulation structure 100C may be configured to be capable of being divided into a plurality of portions in the circumferential direction. Since the heat insulation structure 100C is configured to be capable of being divided into a plurality of portions in the circumferential direction, attachment of the heat insulation structure 100C to the processing container 20 is facilitated.

EXAMPLES

Example for confirming the effects achieved with the heat insulation structures according to the embodiments of the present disclosure will be described.

Example 1

In Example 1, regarding the case where the heat insulation structure was provided in the gap between the inner tube 21 and the outer tube 22 of the vertical heat treatment apparatus described with reference to FIG. 1 and the case where the heat insulation structure is not provided, the temperatures of the lid 28 and the sealing member 29 were measured to evaluate the heat insulation property of the heat insulation structure. In Example 1, the power of heaters 81A to 81F was controlled to adjust the temperature of wafers W to 800° C. As the heat insulation structure, a structure in which a plurality of quartz tubes (having an outer diameter of 30 mm, an inner diameter of 26 mm, and a height of 110 mm) was placed on the support portion 26 along the outer circumferential surface of the inner tube 21 and a blanket-shaped heat insulation material 30 (having a width of 30 mm and a thickness of 12.5 mm) was placed in an annular shape was used. As the blanket-shaped heat insulation material, a flexible ceramic fiber blanket as characterized by No. 5120 #130 available from NICHIAS Corporation was used.

Figure 8A:
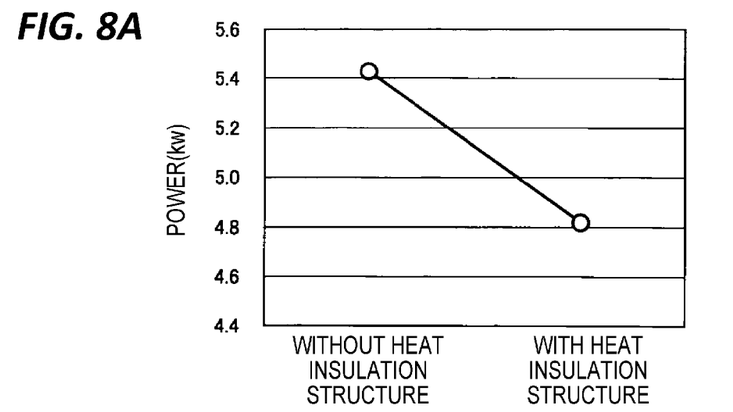
FIGS. 8A to 8C are graphs each representing the relationship between the presence or absence of a heat insulation structure and the temperature of each part.
Figure 8B:
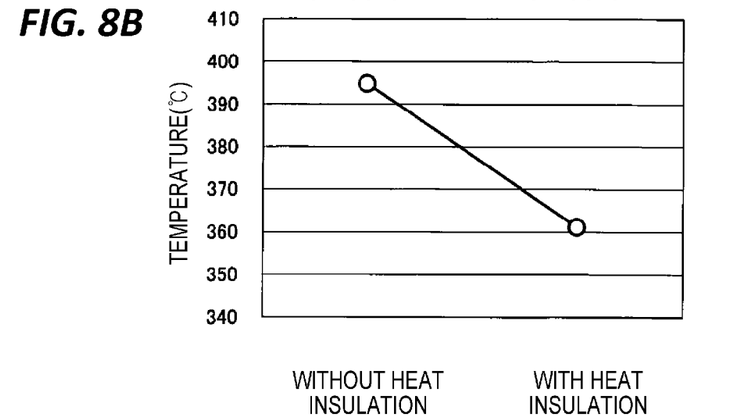
Figure 8C:
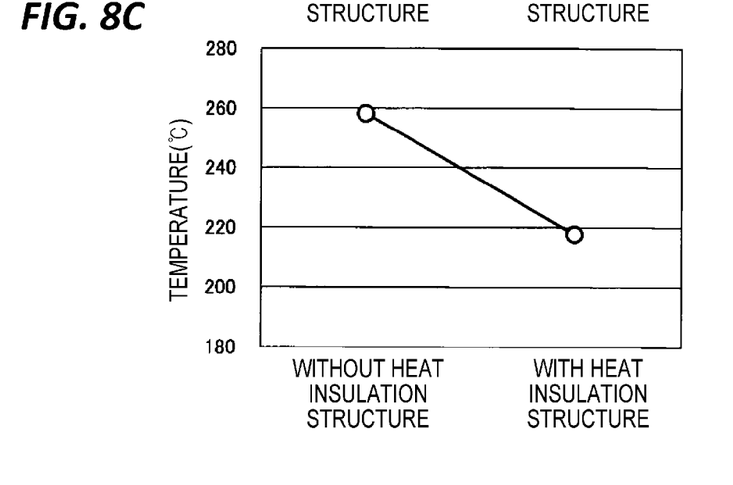

FIGS. 8A to 8C are graphs each representing the relationship between the presence or absence of a heat insulation structure and the temperature of each part. FIG. 8A represents the relationship between the presence or absence of the heat insulation structure and the power (kW) of the heater 81F, FIG. 8B represents the relationship between the presence or absence of the heat insulation structure and the temperature (° C.) of the lid 28, and FIG. 8C represents the relationship between the presence or absence of the heat insulation structure and the temperature of the seal member 29.

As represented in FIG. 8A, by providing the heat insulation structure in the gap between the inner tube 21 and the outer tube 22, it can be seen that the power of the heater 81F when the temperature of the wafer W was adjusted to 800° C. became small. As a result, it is considered that the heat insulation structure 100 suppresses heat movement and heat transfer from the wafer processing region where the wafers W are processed in the processing container 20 to the furnace mouth portion.

Further, as represented in FIGS. 8B and 8C, by providing the heat insulation structure in the gap between the inner tube 21 and the outer tube 22, it can be seen that the temperatures of the lid 28 and the seal member 29 when the temperature of the wafers W was adjusted to 800° C. were lowered. From this, it is considered that it is possible to perform a high-temperature processing on the wafers W in the wafer processing region while maintaining the components such as, for example, the lid member 28 and the sealing member 29 at a relatively low temperature.

Example 2

In Example 2, regarding the case where the heat insulation structure was provided in the gap between the inner tube 21 and the outer tube 22 of the vertical heat treatment apparatus described with reference to FIG. 1 and the case where the heat insulation structure is not provided, the growth rates of films were evaluated when the films were grown on wafers W. In Example 2, as the heat insulation structure, the heat insulation structure 100 of the first embodiment described with reference to FIG. 4 was used, in which the height position of the upper surface of the second upper member 103 was located slightly higher than the height position of the upper end of the gas outlet 27.

Figure 9:
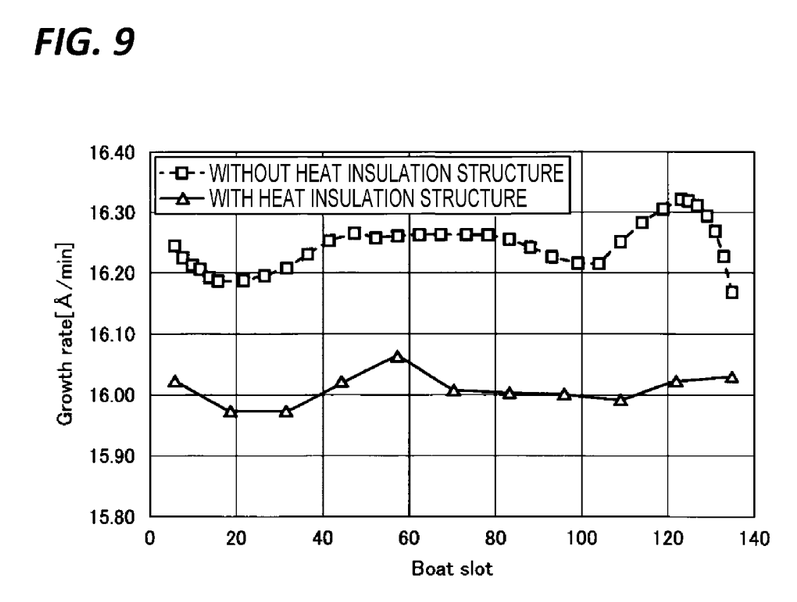
FIG. 9 is a graph representing the relationship between the presence or absence of a heat insulation structure and the inter-surface uniformity of a film growth rate.

FIG. 9 is a graph representing the relationship between the presence or absence of a heat insulation structure and the inter-surface uniformity of a film growth rate. In FIG. 9, the horizontal axis represents a slot position on the wafer boat WB, and the vertical axis represents the film growth rate (Å/min). In the slot position on the wafer boat WB, the uppermost end in the vertical direction was assumed as slot position 0, and the lowermost end was assumed as slot position 140.

As represented in FIG. 9, it can be seen that when the heat insulation structure 100 was not provided (see the square marks in FIG. 9), the film growth rate was increased at slot positions 105 to 125, and after exhibited the maximum value, the film growth rate was abruptly decreased at slot positions 125 to 140. Form this, it is considered that the heat movement or heat transfer from the wafer processing region to the furnace mouth portion is large and thus the power of the heater 81F is higher than that of the other heaters 81A to 81E, whereby the temperature in the vicinity of the heater 81F is locally raised.

In contrast, when the heat insulation structure 100 was provided (see the triangles in FIG. 9), it can be seen that the growth rates of the film at slot positions 105 to 140 are substantially constant. Form this, it is considered that the heat movement or heat transfer from the wafer processing region to the furnace mouth portion was suppressed by the heat insulation structure 100 and thus the power of the heater 81F became substantially equal to that of the other heaters 81A to 81E, whereby the temperature in the vicinity of the heater 81F was suppressed from being locally raised.

Example 3

In Example 3, regarding the case where the heat insulation structure was provided in the gap between the inner tube 21 and the outer tube 22 of the vertical heat treatment apparatus described with reference to FIG. 1 and the case where the heat insulation structure is not provided, the film thicknesses were evaluated when the films were grown on wafers W. In Example 3, as the heat insulation structure, the heat insulation structure 100 of the first embodiment described with reference to FIG. 4 was used, in which the height position of the upper surface of the second upper member 103 was substantially equal to the height position of the lower end of the heater 81F.

Figure 10:
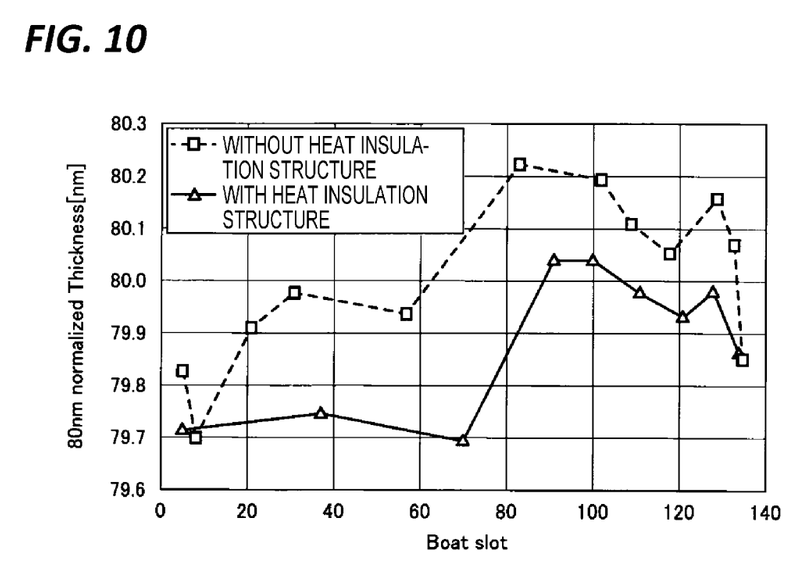
FIG. 10 is a graph representing the relationship between the presence or absence of a heat insulation structure and the inter-surface uniformity of a film thickness.

FIG. 10 is a graph representing the relationship between the presence or absence of a heat insulation structure and the inter-surface uniformity of a film thickness. In FIG. 10, the horizontal axis represents a slot position on the wafer boat WB, and the vertical axis represents a film thickness (nm) normalized to 80 nm, In the slot position on the wafer boat WB, the uppermost end in the vertical direction was assumed as slot position 0, and the lowermost end was assumed as slot position 140.

From FIG. 10, it can be seen that the change in film thickness at the slot positions 130 to 140 is reduced by providing the heat insulation structure in the gap between the inner tube 21 and the outer tube 22. Form this, it is considered that the heat movement or heat transfer from the wafer processing region to the furnace mouth portion was suppressed by the heat insulation structure 100 and thus the power of the heater 81F became substantially equal to that of the other heaters 81A to 81E, whereby the temperature in the vicinity of the heater 81F was suppressed from being locally raised.

In each of the above embodiments, the vertical heat treatment apparatus provided with the gas supply section 40 and the exhaust section 60 on the lower side of the processing container 20 has been described as an example, but the present disclosure is not limited to these embodiments. For example, the vertical heat treatment apparatus may have a configuration in which a gas supply section is provided on the lower side of the processing container and an exhaust section is provided above the processing container.

According to the heat insulation structure disclosed herein, it is possible to suppress heat movement and heat transfer from a wafer-processing region to the furnace mouth portion.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A vertical heat treatment apparatus that performs a heat treatment on a substrate,
the vertical heat treatment apparatus comprising:
a processing container having a double tube structure including an inner tube and an outer tube closed upward, the processing container having an opening at a lower end thereof;
a gas supply section and exhaust section provided on a lower side of the processing container;
a lid configured to introduce or discharge the substrate into or from the opening and to open/close the opening;
a heating section provided to cover the processing container from an outside; and
a heat insulation structure including a plate-shaped member provided along an outer circumference of the inner tube between the inner tube and the outer tube,
wherein the plate-shaped member includes a plurality of first arc members along the outer circumference of the inner tube at a first height position in a vertical direction, and a plurality of second arc members provided along the outer circumference of the inner tube at a second position different from the first height position, and
the first arc members and the second arc members are alternately arranged along the outer circumference of the inner tube, and the first and second arc members, which are adjacent to each other, are arranged to partially overlap in a plan view.

2. The vertical heat treatment apparatus of claim 1, wherein the plate-shaped member is formed in a C shape having a notch formed at a position corresponding to the exhaust section in a plan view.

3. The vertical heat treatment apparatus of claim 1, further comprising:
a support member configured to support the plate-shaped member.

4. The vertical heat treatment apparatus of claim 3, wherein an annular support portion is formed on a lower inner wall of the outer tube, and
the support member includes a lower member disposed on the support portion, and a connection member configured to connect the lower member and the plate-shaped member.

5. The vertical heat treatment apparatus of claim 3, wherein an annular support portion is formed on a lower inner wall of the outer tube, and
the support member includes a lower member disposed on the support portion, and a connection member configured to connect the lower member and the plate-shaped member.

6. The vertical heat treatment apparatus of claim 1, wherein a height position of an uppermost portion in the heat insulation structure is set to be higher than a position of an upper end of the exhaust section.

7. The vertical heat treatment apparatus of claim 1, wherein a height position of an upper side of the plate-shaped member is set to be lower than a lower end of a substrate holder accommodated in the processing container and a lower end of the heating section disposed on an outer circumference side of the processing container.

* * * * *